US012323114B2

(12) United States Patent
Li et al.

(10) Patent No.: US 12,323,114 B2
(45) Date of Patent: Jun. 3, 2025

(54) BIASING SOLUTION FOR PUSH-PULL POWER AMPLIFIER FOR LOW LOADLINE AND HIGH COMMON MODE REJECTION RATIO BACKGROUND (71) Applicant: SKYWORKS SOLUTIONS, INC., Irvine, CA (US)

(72) Inventors: Xiaoqiang Li, Thousand Oaks, CA (US); Shihan Qin, Newbury Park, CA (US); Nathan Lucas Nuzum, Quasqueton, IA (US); Tianming Chen, Newbury Park, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 415 days.

(21) Appl. No.: 17/805,714

(22) Filed: Jun. 7, 2022

(65) Prior Publication Data
US 2022/0393654 A1 Dec. 8, 2022

Related U.S. Application Data (60) Provisional application No. 63/197,597, filed on Jun. 7, 2021.

(51) Int. Cl.
*H03F 3/24* (2006.01)
*H04B 1/40* (2015.01)

(52) U.S. Cl.
CPC ............... *H03F 3/245* (2013.01); *H04B 1/40* (2013.01); *H03F 2200/09* (2013.01); *H03F 2200/294* (2013.01)

(58) Field of Classification Search
CPC ...... H03F 3/245; H03F 3/24; H03F 2200/294; H03F 2200/09; H03F 2200/06; H04B 1/40; H04B 1/04
See application file for complete search history.

(56) References Cited

U.S. PATENT DOCUMENTS 3,714,597 A * 1/1973 Reynolds .................. H03F 1/48
330/276
8,339,203 B2 * 12/2012 Visser ...................... H03H 7/42
330/301

* cited by examiner

*Primary Examiner* — Tuan H Nguyen
(74) *Attorney, Agent, or Firm* — Lando & Anastasi, LLP (57) ABSTRACT Examples of the disclosure include a wireless device comprising a power amplifier configured to output a balanced amplified signal, an antenna configured to transmit and receive signals, a balun coupled to the power amplifier and the antenna, and being configured to receive the balanced amplified signal and output, based on the balanced amplified signal, an unbalanced amplified signal to the antenna, and at least one capacitor coupled in series between the power amplifier and the balun.

23 Claims, 5 Drawing Sheets

BIASING SOLUTION FOR PUSH-PULL POWER AMPLIFIER FOR LOW LOADLINE AND HIGH COMMON MODE REJECTION RATIO BACKGROUND

CROSS-REFERENCE TO RELATED APPLICATIONS

This application claims priority under 35 U.S.C. § 119(e) to U.S. Provisional Application Ser. No. 63/197,597, titled "BIASING SOLUTION FOR PUSH-PULL POWER AMPLIFIER FOR LOW LOADLINE AND HIGH COMMON MODE REJECTION RATIO BACKGROUND," filed on Jun. 7, 2021, which is hereby incorporated by reference in its entirety.

BACKGROUND

1. Field of the Disclosure

At least one example in accordance with the present disclosure relates generally to electrical-device biasing, and more particularly to biasing a push-pull power amplifier.

2. Discussion of Related Art

Electronic devices, such as mobile cellular devices, may exchange information with other electronic devices. A mobile cellular device may include an antenna to transmit and receive signals. Some mobile cellular devices may include additional components and circuitry to process signals transmitted and received via the antenna. For example, a mobile cellular device may include one or more power amplifiers to amplify a signal transmitted or received via the antenna.

SUMMARY

According to at least one aspect of the present disclosure include a wireless device comprising a power amplifier configured to output a balanced amplified signal, an antenna configured to transmit and receive signals, a balun coupled to the power amplifier and the antenna, and configured to receive the balanced amplified signal and output, based on the balanced amplified signal, an unbalanced amplified signal to the antenna, and at least one capacitor coupled in series between the power amplifier and the balun.

In some examples, the balun includes a transformer having a primary winding and a secondary winding, and wherein the primary winding includes a positive connection and a negative connection. In various examples, the power amplifier includes a positive differential output configured to be coupled to the positive connection of the primary winding, and a negative differential output configured to be coupled to the negative connection of the primary winding. In at least one example, the positive differential output is coupled to the positive connection of the primary winding via at least one first wirebond connection, and wherein the negative differential output is coupled to the negative connection of the primary winding via at least one second wirebond connection.

In some examples, the at least one first wirebond connection includes a first wirebond connection and a second wirebond connection coupled in parallel, and wherein the at least one second wirebond connection includes a third wirebond connection and a fourth wirebond connection coupled in parallel. In at least one example, the at least one capacitor is coupled in series with at least one of the at least one first wirebond connection or the at least one second wirebond connection. In various examples, the at least one capacitor includes a first capacitor coupled in series with the at least one first wirebond connection, and a second capacitor coupled in series with the at least one second wirebond connection.

In some examples, the first capacitor is a variable capacitor having a first variable capacitance, and wherein the second capacitor is a variable capacitor having a second variable capacitance. In at least one example, the first variable capacitance is varied independently of the second variable capacitance. In various examples, the first variable capacitance and the second variable capacitance are selected to balance the balun, and wherein balancing the balun includes increasing a common-mode rejection ratio of the wireless device.

In some examples, the first variable capacitance is selected to balance at least one of a parasitic inductance of the at least one first wirebond connection or a leakage inductance of the primary winding, and the second variable capacitance is selected to balance at least one of a parasitic inductance of the at least one second wirebond connection or the leakage inductance of the primary winding. In at least one example, the wireless device includes a controller, and the controller is configured to tune a capacitance of the at least one capacitor. In various examples, the controller is configured to tune the capacitance of the at least one capacitor to balance at least one of a leakage inductance of the primary winding or a parasitic inductance of at least one of the at least one first wirebond connection or the at least one second wirebond connection.

In some examples, the wireless device includes at least one third wirebond connection coupled in parallel with a series combination of the at least one capacitor and the at least one of the at least one first wirebond connection or the at least one second wirebond connection. In at least one example, the at least one third wirebond connection shunts a DC voltage around the at least one capacitor. In various examples, the at least one capacitor includes a first capacitor coupled in series with the at least one first wirebond connection, and a second capacitor coupled in series with the at least one second wirebond connection.

In some examples, the at least one third wirebond connection includes a third wirebond connection and a fourth wirebond connection, the third wirebond connection is coupled in parallel with a series combination of the first capacitor and the at least one first wirebond connection, and the fourth wirebond connection is coupled in parallel with a series combination of the second capacitor and the at least one second wirebond connection. In at least one example, the wireless device includes a shunt capacitor, the power amplifier includes a positive differential output and a negative differential output, and the shunt capacitor includes a first connection coupled to the positive differential output and a second connection coupled to the negative differential output.

According to aspects of the disclosure, a method of using a wireless device is provided comprising providing a power amplifier, an antenna, a balun, and at least one capacitor, coupling the power amplifier to a balanced-line connection of the balun, coupling the antenna to an unbalanced-line connection of the balun, and coupling the at least one capacitor in series between the power amplifier and the balun.

In some examples, coupling the at least one capacitor in series between the power amplifier and the balun includes coupling a first capacitor in series between a positive differential output of the power amplifier and a positive connection of a primary winding of the balun, and coupling a second capacitor in series between a negative differential output of the power amplifier and a negative connection of the primary winding of the balun. In at least one example, the method includes tuning a capacitance of the at least one capacitor. In various examples, the method includes tuning a first capacitance of the first capacitor, and tuning a second capacitance of the second capacitor independently of tuning the first capacitance.

According to aspects of the disclosure, a wireless-device system is provided comprising a power amplifier configured to output a balanced amplified signal, an antenna configured to transmit and receive signals, a balun coupled to the power amplifier via a differential connection, and coupled to the antenna, and configured to receive the balanced amplified signal and output, based on the balanced amplified signal, an unbalanced amplified signal to the antenna, and means for reducing a load line of the differential connection.

In some examples, the balun includes a transformer having a primary winding, and wherein the means for reducing the load line of the differential connection includes means for balancing the primary winding of the balun. In at least one example, the means for reducing the load line of the differential connection further includes means for providing a DC signal from the power amplifier to the balun.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Figure 1:
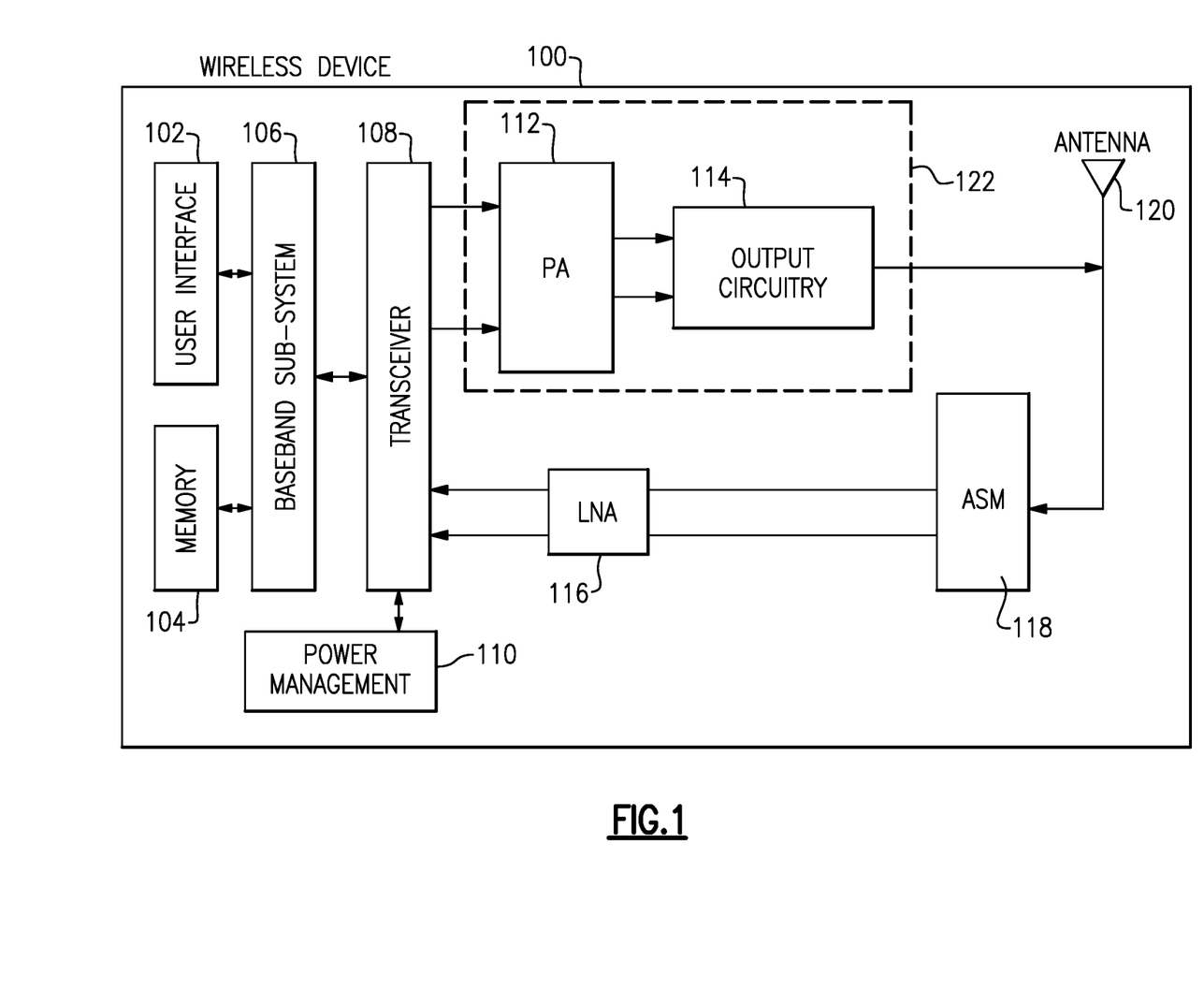
FIG. 1 illustrates a block diagram of a wireless device according to an example.

FIG. 1 is a block diagram of a wireless device 100 according to an example. The wireless device 100 may be an electronic device, such as a cellular phone, smart phone, tablet, modem, communication network or any other portable or non-portable device configured for voice and/or data communication. The wireless device 100 includes a user interface 102, memory and/or storage 104, a baseband sub-system 106, a transceiver 108, a power-management system 110, a power-amplifier (PA) module 112, output circuitry 114, at least one low-noise amplifier (LNA) 116 ("LNA 116"), a switching circuit 118 (also referred to as an antenna switch module [ASM]), and an antenna 120. As discussed in greater detail below, a transmit portion 122 of the wireless device 100 includes the PA module 112 and the output circuitry 114. No limitation is implied by the term "transmit portion 122," and it is to be appreciated that the PA module 112 and/or the output circuitry 114 may be utilized for purposes other than, or in addition to, transmission of signals.

The antenna 120 is configured to transmit and/or receive one or more signals, such that the wireless device 100 may communicate with one or more external devices via the antenna 120. The transceiver 108 is configured to generate signals for transmission and/or to process received signals. In some embodiments, transmission and reception functionalities can be implemented in separate components (for example, a transmit module and a receiving module) or be implemented in the same module.

Signals generated for transmission are provided from the transceiver 108 to the PA module 112, which amplifies the generated signals from the transceiver 108. As will be appreciated by those skilled in the art, the PA module 112 can include one or more power amplifiers. The PA module 112 can be used to amplify a wide variety of RF or other frequency-band transmission signals. For example, the PA module 112 can receive an enable signal that can be used to pulse the output of the power amplifier to aid in transmitting a wireless local-area-network (WLAN) signal or any other suitable pulsed signal. The PA module 112 can be configured to amplify any of a variety of types of signal, including, for example, a Global System for Mobile (GSM) signal, a code-division multiple-access (CDMA) signal, a W-CDMA signal, a Long-Term-Evolution (LTE) signal, or an EDGE signal. In certain embodiments, the PA module 112 and associated components including switches and the like can be fabricated on GaAs substrates using, for example, pHEMT or BiFET transistors, or on a silicon substrate using CMOS transistors. The wireless device 100 also includes the LNA 116, which may include one or more LNAs configured to amplify received signals.

The wireless device 100 also includes the switching circuit 118, which is configured to switch between different bands and/or modes. For example, the switching circuit 118 may be configured to couple the LNA 116 to the antenna 120 in a receive mode of operation and to decouple the LNA 116 from the antenna 120 in a transmit mode of operation. Similarly, the PA module 112 is coupled to the antenna 120 such that signals provided to the antenna 120 from the PA module 112 in the transmit mode of operation bypass the receive path (and switching circuit 118) of the wireless device 100.

Accordingly, in certain embodiments the antenna 120 can both receive signals that are provided to the transceiver 108 via the switching circuit 118 and the LNA 116 and also transmit signals from the wireless device 100 via the transceiver 108, the PA module 112, and the output circuitry 114. However, in other examples multiple antennas can be used for different modes of operation, and in some instances, an ASM (for example, including, alternate to, or in addition to, the switching circuit 118) may be coupled between the output circuitry 114 and the antenna 120.

The power-management system 110 is connected to the transceiver 108 and is configured to manage the power for the operation of the wireless device 100. The power-management system 110 can also control the operation of the wireless device 100, such as by controlling components of the output circuitry 114. The power-management system 110 can include, or can be connected to, a battery that supplies power for the various components of the wireless device 100. The power-management system 110 can further include one or more processors or controllers which can control the transmission of signals and can also configure components of the wireless device 100 based upon the frequency of the signals being transmitted or received, for example. In addition, the processor(s) or controller(s) of the power-management system 110 may provide control signals to actuate switches, tune components, or otherwise configure components of the wireless device 100, such as components of the transmit portion 122, as discussed below. In at least one embodiment, the processor(s) or controller(s) of the power-management system 110 can also provide control signals to control the switching circuit 118 to operate in the transmit or receive mode.

In one embodiment, the baseband sub-system 106 is connected to the user interface 102 to process input and output of voice and/or data provided to and received from the user. The baseband sub-system 106 can also be connected to the memory and/or storage 104 which is configured to store data and/or instructions to control the operation of the wireless device, and/or to provide storage of information for the user.

The output circuitry 114 includes one or more components to process one or more signals output by the PA module 112. For example, the output circuitry 114 may include one or more couplers, sensor modules, impedance-matching networks, and so forth. In some examples, the output circuitry 114 may further include a balun. A balun is a device configured to couple, and enable communication between, a balanced line (for example, a differential line) and a single-ended line (including, for example, a grounded line), or "unbalanced line." For example, the PA module 112 may include at least one PA configured to output a differential signal on a balanced line. However, the antenna 120 may operate on an unbalanced line. Accordingly, a balun may enable a balanced signal output by the PA module 112 to be transformed into an unbalanced signal to be provided to the antenna 120.

In examples in which the output circuitry 114 includes at least one balun, it may be advantageous for a load line between the PA module 112 and the balun to be at a low impedance (that is, for there to be a "low load line" between the PA module 112 and the balun), particularly for high-linearity performance at low voltage biases. For example, where the balun is a transformer-type balun, a leakage inductance from the balun may frustrate efforts to achieve a low load line at higher frequencies of signals output by the PA module 112. Furthermore, parasitic inductances owing to on-chip wirebonding may further complicate these efforts. Although the balun itself may be re-designed to achieve the low load line based on properties of the wireless device 100—for example, by altering a coupling factor of a transformer-type balun—such re-designing may be time- and labor-intensive.

Examples of this disclosure include a wireless device having at least one tunable capacitor coupled between a PA module and a balun. In one example, at least one tunable capacitor is coupled between a PA output and a wirebond connection coupling the PA to the balun. In some examples, an additional wirebond connection is formed to directly connect the PA output to the balun in parallel with the at least one tunable capacitor. In some examples, at least one tunable capacitor is coupled between a negative PA module differential output and a wirebond connection coupled to one of a positive or negative connection of the balun, and at least one tunable capacitor is also coupled between a positive PA module differential output and a wirebond connection coupled to the other of the positive or negative connection of the balun.

Figure 2:
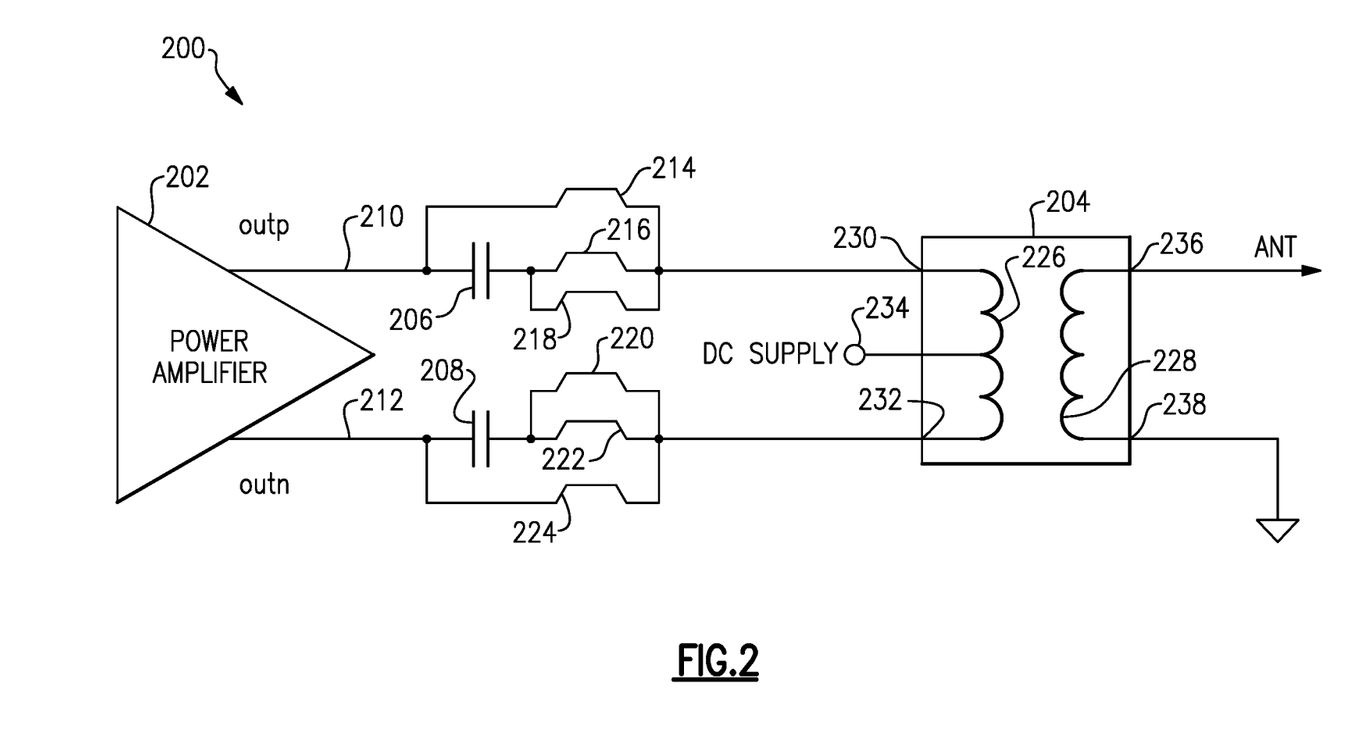
FIG. 2 illustrates a schematic diagram of transmit circuitry according to an example.

FIG. 2 illustrates a schematic diagram of transmit circuitry 200 according to an example. For example, the transmit circuitry 200 may be an example of at least part of the transmit portion 122 shown in FIG. 1. The transmit circuitry 200 includes a PA 202, a balun 204, a first capacitor 206, a second capacitor 208, a positive PA output line 210, a negative PA output line 212, a first wirebond connection 214, a second wirebond connection 216, a third wirebond connection 218, a fourth wirebond connection 220, a fifth wirebond connection 222, and a sixth wirebond connection 224. The balun 204 includes a primary winding 226 and a secondary winding 228. The primary winding 226 includes a positive connection 230, a negative connection 232, and a DC-supply connection 234. The secondary winding 228 includes an output-line connection 236 to couple to an output line, and a reference-line connection 238 to couple to a reference line.

A positive differential output of the PA 202 is coupled to the first capacitor 206 and the first wirebond connection 214 via the positive PA output line 210. A negative differential output of the PA 202 is coupled to the second capacitor 208 and the sixth wirebond connection 224 via the negative PA output line 212. The first capacitor 206 is coupled to the positive PA output line 210 at a first connection, and is coupled to the second wirebond connection 216 and third wirebond connection 218 at a second connection. The second capacitor 208 is coupled to the negative PA output line 212 at a first connection, and is coupled to the fourth wirebond connection 220 and fifth wirebond connection 222 at a second connection.

The first wirebond connection 214 is coupled to the positive PA output line 210 at a first connection, and is coupled to the positive connection 230 of the balun 204 at a second connection. The second wirebond connection 216 is coupled to the first capacitor 206 at a first connection, is coupled to the positive connection 230 of the balun 204 at a second connection, and is coupled in parallel with the third wirebond connection 218. The third wirebond connection 218 is coupled to the first capacitor 206 at a first connection, is coupled to the positive connection 230 of the balun 204 at a second connection, and is coupled in parallel with the second wirebond connection 216.

The fourth wirebond connection 220 is coupled to the second capacitor 208 at a first connection, is coupled to the negative connection 232 of the balun 204 at a second connection, and is coupled in parallel with the fifth wirebond connection 222. The fifth wirebond connection 222 is coupled to the second capacitor 208 at a first connection, is coupled to the negative connection 232 of the balun 204 at a second connection, and is coupled in parallel with the fourth wirebond connection 220. The sixth wirebond connection 224 is coupled to the negative PA output line 212 at a first connection, and is coupled to the negative connection 232 of the balun 204 at a second connection.

The primary winding 226 is coupled to the first wirebond connection 214, the second wirebond connection 216, and the third wirebond connection 218 via the positive connection 230, is coupled to the fourth wirebond connection 220, the fifth wirebond connection 222, and the sixth wirebond connection 224 via the negative connection 232, is configured to be coupled to a DC-power supply (not illustrated), such as a battery, via the DC-supply connection 234, and is magnetically coupled to the secondary winding 228. The secondary winding 228 is coupled to an output line via the output-line connection 236, and is coupled to a reference node (for example, a neutral node) via the reference-line connection 238. In one example, the output may be coupled to an antenna, such as the antenna 120 of FIG. 1.

A differential signal output by the PA 202 via the PA output lines 210, 212 may be transformed into an unbalanced signal by the balun 204, and the unbalanced signal may be provided to an antenna, such as the antenna 120, via the output-line connection 236 of the secondary winding 228. To provide an electrical signal from the PA 202 to the balun 204, the PA 202 is electrically coupled to the balun 204. One method of coupling electrical components is via wirebonding. For example, the wirebond connections 214-224 may electrically couple the PA output lines 210, 212 to the connections 230, 232 of the balun 204. However, the wirebond connections 214-224 may induce a parasitic inductance that complicates achieving a low load line, as discussed above. Moreover, the windings 226, 228 of the balun 204 may induce a leakage inductance which further complicates such efforts.

The capacitors 206, 208 may be implemented to at least partially counteract these parasitic and leakage inductances. In some examples, the capacitors 206, 208 may be tunable, that is, the capacitors 206, 208 may have an adjustable capacitance. For example, the power-management system 110 may include one or more controllers configured to be communicatively coupled to the capacitors 206, 208 to modulate a capacitance of the capacitors 206, 208 and thereby at least partially balance an imaginary load induced by the parasitic and leakage inductances. In one example, each of the capacitors 206, 208 may include one or more capacitors. For example, each of the capacitors 206, 208 may include a network of switchable capacitors capable of being switched in and out of an electrically conductive path such that the power-management system 110 may modulate a total capacitance of the capacitors 206, 208. The capacitors 206, 208 may each be independently tunable, and may be independently tuned to minimize and balance a load line of the balun 204.

Using the first capacitor 206 as an example, the second wirebond connection 216 and third wirebond connection 218 provide an electrical connection between the positive PA output line 210 and the positive connection 230 of the balun 204. However, the wirebond connections 216, 218 induce a parasitic inductance, and the primary winding 226 induces a leakage inductance. In some examples, the transmit circuitry 200 may include only one of the wirebond connections 216, 218, and the other may be omitted. For example, the third wirebond connection 218 may be omitted in some examples, and the second wirebond connection 216 may still conduct signals between the first capacitor 206 and the positive connection 230. However, the addition of the third wirebond connection 218 may be advantageous in some examples at least because a total inductance of the parallel combination of the wirebond connections 216, 218 is less than an individual inductance of either of the wirebond connections 216, 218. In some examples, however, one of the wirebond connections 216, 218 may be omitted, or additional wirebond connections may be coupled in parallel with the wirebond connections 216, 218. Similar principles apply to the wirebond connections 220, 222.

The first capacitor 206 may be connected in series with the wirebond connections 216, 218 and tuned to a desired capacitance to balance the inductances of the wirebond connections 216, 218 and/or primary winding 226. For example, a capacitance of the first capacitor 206 may be tuned such that, at least one in-band frequency, the first capacitor 206 resonates with respect to the parasitic inductance of the wirebond connections 216, 218 and the leakage inductance of the primary winding 226, such that the first capacitor 206 substantially neutralizes these inductances. As discussed below, the power-management system 110 may receive information indicative of the wireless device 100, including information indicative of the inductances and/or the load lines, such that the first capacitor 206 may be tuned to a desired state. In some examples, a capacitance of the first capacitor 206 may be repeatedly adjusted based on the information indicative of the wireless device 100, such as in response to changes in the inductances and/or the load lines. The second capacitor 208 may be operated substantially similarly.

In some examples, the first capacitor 206 may block a DC voltage conducted on the positive PA output line 210. Accordingly, the first wirebond connection 214 advantageously shunts the first capacitor 206 such that a DC voltage conducted on the positive PA output line 210 is conducted to the positive connection 230 of the balun 204. In various examples, the first capacitor 206 may be tuned to mitigate or eliminate a parasitic inductance of the first wirebond connection 214. The sixth wirebond connection 224 may be similar, and the second capacitor 208 may be operated substantially similarly.

It may be advantageous to maximize a common-mode rejection ratio (CMRR) of systems having a differential amplifier, such as the PA 202. However, it may be difficult or impossible in practice to achieve an ideal (for example, infinite) CMRR in a real system. Using the transmit circuitry 200 as an example, a connection between the positive output of the PA 202 and the positive connection 230 may not be perfectly balanced with a connection between the negative output of the PA 202 and the negative connection 232 in a real system. For example, the balun 204 may be imbalanced, causing a CMRR of the PA 202 to deviate from an ideal value.

In various examples, the capacitors 206, 208 may be independently tuned to increase a CMRR of the PA 202. That is, because the first capacitor 206 may be tuned separately from the second capacitor 208, and vice versa, the capacitors 206, 208 may be tuned to different values. Tuning the capacitors 206, 208 to different values enables an imbalance in the connections between the PA 202 and the balun 204 to be mitigated, thereby increasing a CMRR of the PA 202. For example, an imbalance of the balun 204 may be mitigated by tuning the capacitors 206, 208 to different values corresponding to the imbalance, thereby achieving a high common-mode rejection.

Figure 3:
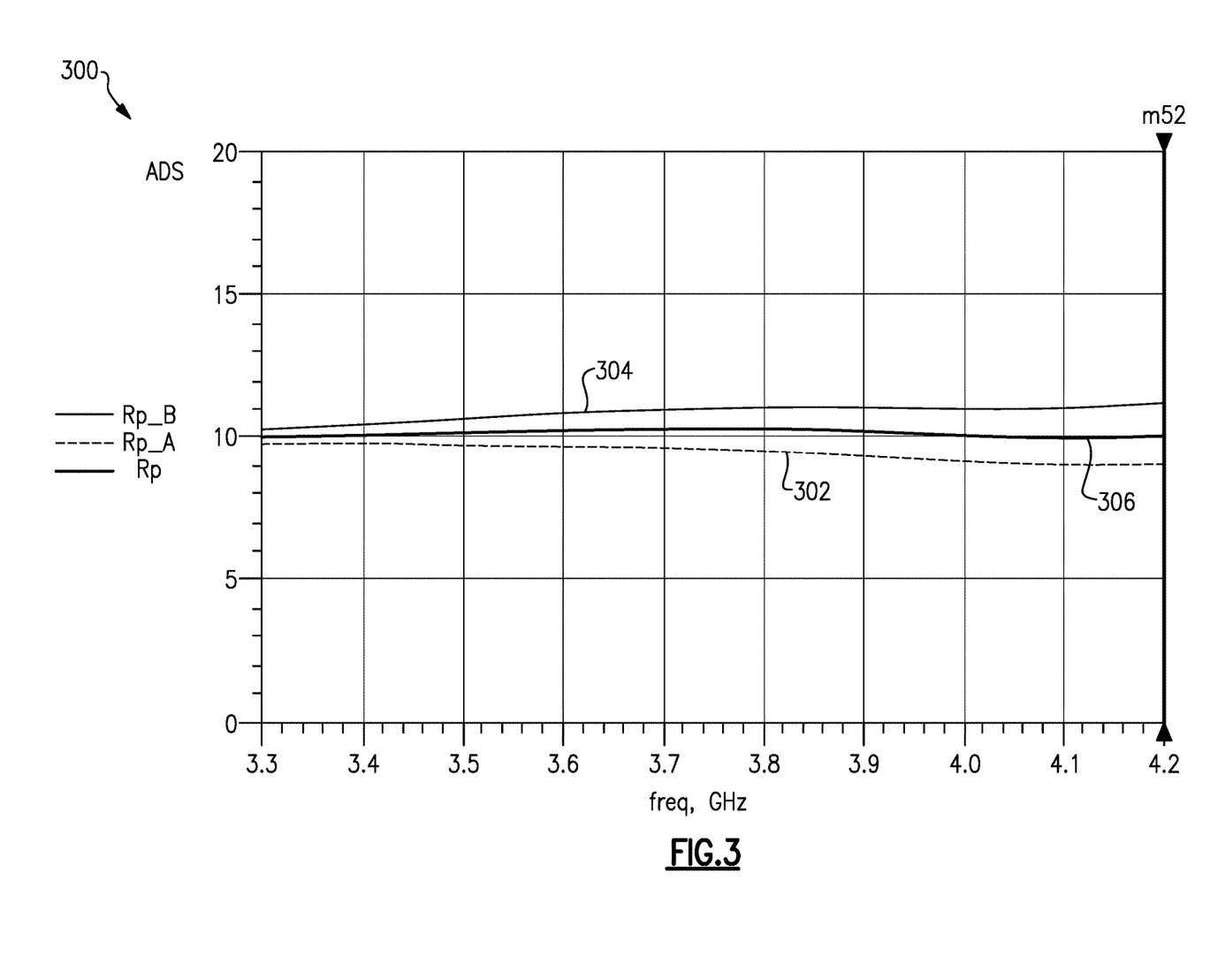
FIG. 3 illustrates a graph of load responses according to an example.

To illustrate the foregoing principles, FIG. 3 illustrates a graph 300 of load responses according to an example. The graph 300 may illustrate load responses of transmit circuitry not utilizing tunable capacitors. For example, the graph 300 may illustrate load responses of transmit circuitry similar to the transmit circuitry 200, but in which the capacitors 206, 208 are replaced with short circuits, and the wirebond connections 214, 224 are not present.

An x-axis of the graph 300 indicates a frequency of a signal conducted by the transmit circuitry 200, and a y-axis of the graph 300 indicates a magnitude of a load presented to the signal. The graph 300 includes a first trace 302, a second trace 304, and a third trace 306. The first trace 302 is indicative of a first load line between a positive differential output of a PA and a positive connection of a balun primary winding. The second trace 304 is indicative of a second load line between a negative differential output of the PA and a negative connection of the balun primary winding. The third trace 306 is an average load line between the first load line and the second load line.

As indicated by the traces 302-306, a load between the PA and the balun is approximately 10Ω, which may be considered relatively high for certain applications. Furthermore, as indicated by the traces 302, 306, the first load line and second load line increasingly diverge as a frequency is increased. The increasing difference in the load lines may indicate a system imbalance, which may yield a relatively low CMRR.

Figure 4:
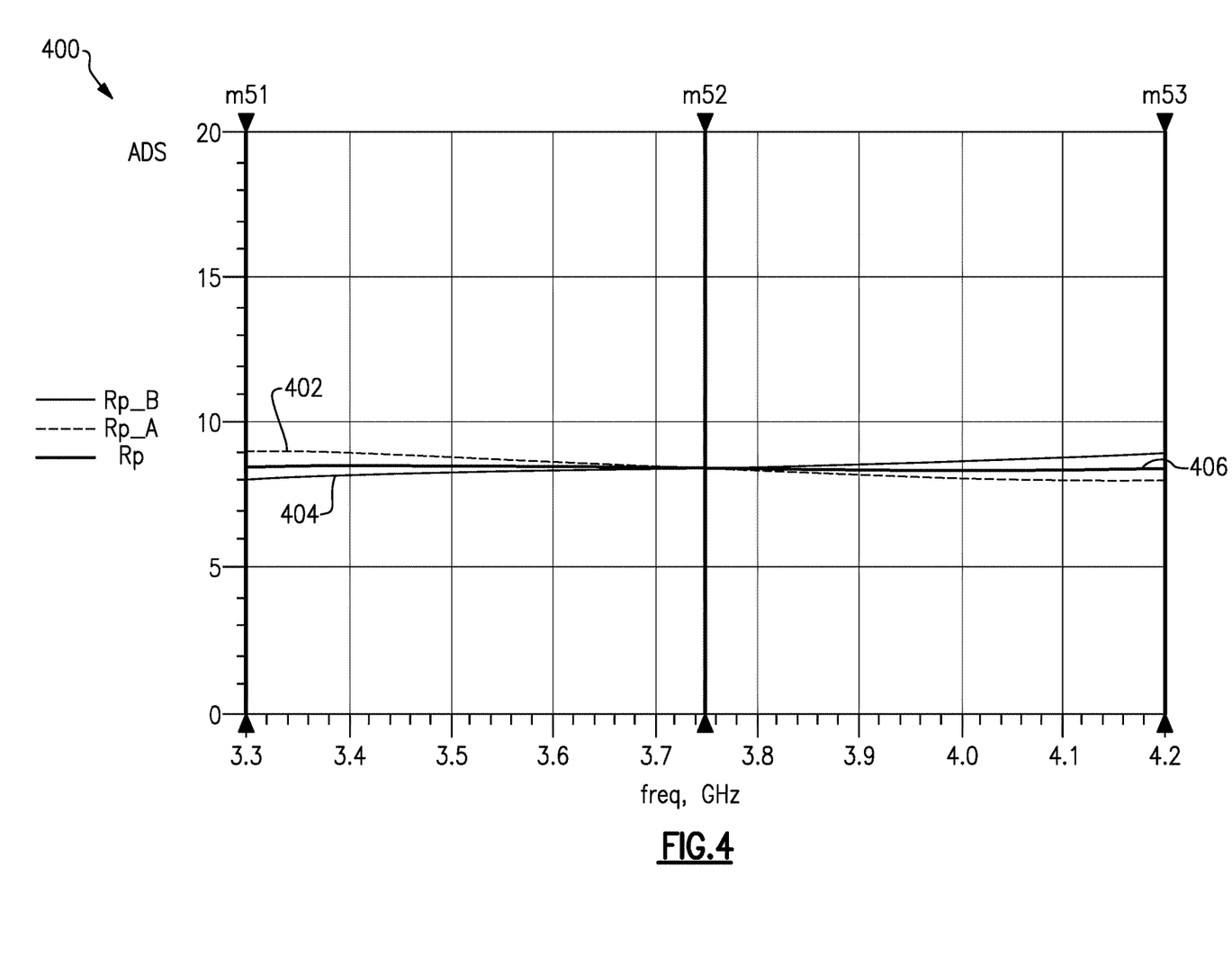
FIG. 4 illustrates a graph of load responses according to another example.

By contrast, FIG. 4 illustrates a graph 400 of load responses of the transmit circuitry 200 according to an example. An x-axis of the graph 400 indicates a frequency of a signal, and a y-axis of the graph 400 indicates a magnitude of a load presented to the signal. The graph 400 includes a first trace 402, a second trace 404, and a third trace 406. The first trace 402 is indicative of a first load line between a positive differential output of the PA 202 and the positive connection 230 of the balun 204. The second trace 404 is indicative of a second load line between a negative differential output of the PA 202 and the negative connection 232 of the balun 204. The third trace 406 is an average load line between the first load line and the second load line.

As indicated by the traces 402-406, a load between the PA 202 and the balun 204 may be approximately 8.5Ω, which is approximately 15% lower than in a circuit in which the capacitors 206, 208 are omitted. Moreover, as indicated by the traces 402, 406, the first load line and the second load line are significantly more balanced, and converge at approximately 3.75 GHz, which advantageously increases a CMRR around approximately 3.75 GHz. In various examples, an operating frequency of the transmit circuitry 200 may be approximately 3.75 GHz, and the capacitors 206, 208 may be tuned to maximize the CMRR at approximately 3.75 GHz. In examples in which the operating frequency of the transmit circuitry 200 is not approximately 3.75 GHz, the capacitors 206, 208 may be tuned differently such that the load lines converge at that operating frequency. For example, the transmit circuitry 200 may operate across several frequencies in operation, and the capacitors 206, 208 may be repeatedly (for example, continuously, periodically, or aperiodically) re-tuned as the operating frequency changes. Accordingly, the tunable capacitors 206, 208 enable a significant reduction in load lines and a significant increase in CMRR in a connection between a PA and a balun.

Figure 5:
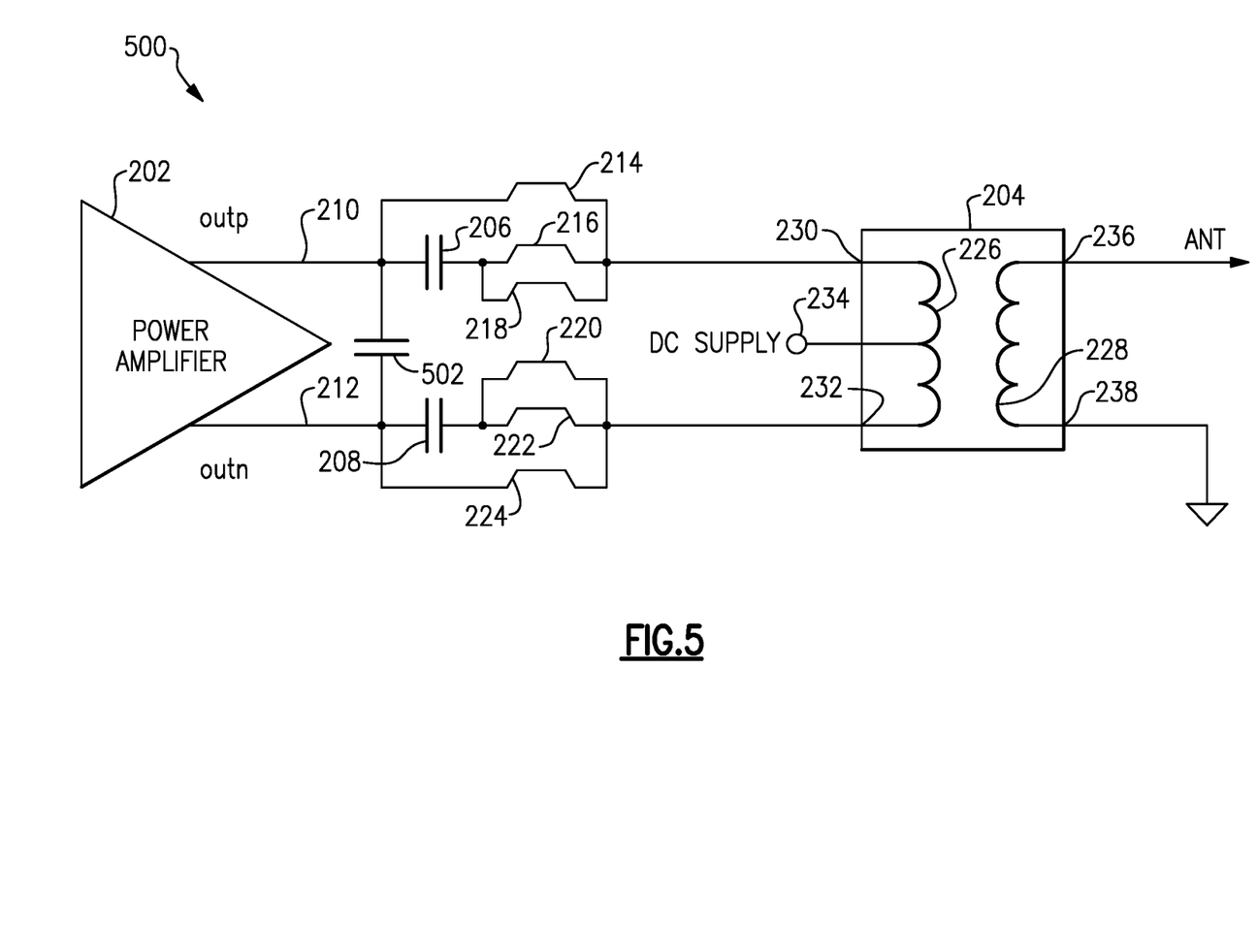
FIG. 5 illustrates a schematic diagram of transmit circuitry according to another example.

Various modifications are within the scope of the disclosure. For example, FIG. 5 illustrates a schematic diagram of transmit circuitry 500 according to another example. The transmit circuitry 500 may be an example of at least part of the transmit portion 122. The transmit circuitry 500 is substantially similar to the transmit circuitry 200, and further includes a third capacitor 502. The third capacitor 502 is coupled between the positive PA output line 210 and the negative PA output line 212. Although the third capacitor 502 is illustrated separately from the PA 202 for purposes of explanation, in some examples, the third capacitor 502 may be internal to the PA 202, and may internally couple a positive output of the PA 202 to a negative output of the PA 202.

The third capacitor 502 may advantageously balance an imaginary load of the primary winding 226. In some examples, the third capacitor 502 may be configured to resonate with the primary winding 226 at an operating frequency of the transmit circuitry 500. The third capacitor 502 may be tunable to the operating frequency of the transmit circuitry 500. For example, the third capacitor 502 may be tunable by the power-management system 110. Furthermore, in some examples, a similar capacitor, which may be tunable, may be coupled in parallel with the secondary winding 228 in addition to, or in lieu of, the third capacitor 502.

As discussed above, the output circuitry 114 may include one or more components, including a balun, such as the balun 204. In some examples, the output circuitry 114 may include alternate components in addition to, or in lieu of, the balun. For example, the output circuitry 114 may include a coupler having one or more coupler sections for measuring transmitted power signals from the PA module 112 and for providing one or more coupled signals to a sensor module. The output circuitry 114 may include the sensor module, which can in turn send information to the power-management system 110 and/or directly to the PA module 112 as feedback for making adjustments to regulate the power level of the PA module 112. In this way, the power-management system 110 may receive feedback information and, based on the feedback information, tune one or more capacitors, such as the capacitors 206, 208, 502. In other examples, the power-management system 110 may be coupled to one or more other sensors and/or probes, which may or may not be included in the output circuitry 114, to provide information to the power-management system 110.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A wireless device comprising:
a power amplifier configured to output a balanced amplified signal;
an antenna configured to transmit and receive signals;
a balun coupled to the power amplifier via a plurality of wirebond connections and coupled to the antenna, and being configured to receive the balanced amplified signal and output, based on the balanced amplified signal, an unbalanced amplified signal to the antenna; and
at least one capacitor coupled in series between the power amplifier and the balun.

2. The wireless device of claim 1 wherein the balun includes a transformer having a primary winding and a secondary winding, and wherein the primary winding includes a positive connection and a negative connection.

3. The wireless device of claim 2 wherein the power amplifier includes a positive differential output configured to be coupled to the positive connection of the primary winding, and a negative differential output configured to be coupled to the negative connection of the primary winding.

4. The wireless device of claim 3 wherein the plurality of wirebond connections includes at least one first wirebond connection and at least one second wirebond connection, wherein the positive differential output is coupled to the positive connection of the primary winding via the at least one first wirebond connection, and wherein the negative differential output is coupled to the negative connection of the primary winding via the at least one second wirebond connection.

5. The wireless device of claim 4 wherein the at least one first wirebond connection includes a first wirebond connection and a second wirebond connection coupled in parallel, and wherein the at least one second wirebond connection includes a third wirebond connection and a fourth wirebond connection coupled in parallel.

6. The wireless device of claim 4 wherein the at least one capacitor is coupled in series with at least one of the at least one first wirebond connection or the at least one second wirebond connection.

7. The wireless device of claim 6 wherein the at least one capacitor includes a first capacitor coupled in series with the at least one first wirebond connection, and a second capacitor coupled in series with the at least one second wirebond connection.

8. The wireless device of claim 7 wherein the first capacitor is a variable capacitor having a first variable capacitance, and wherein the second capacitor is a variable capacitor having a second variable capacitance.

9. The wireless device of claim 8 wherein the first variable capacitance is varied independently from the second variable capacitance.

10. The wireless device of claim 9 wherein the first variable capacitance and the second variable capacitance are selected to balance the balun, and wherein balancing the balun includes increasing a common-mode rejection ratio of the wireless device.

11. The wireless device of claim 8 wherein the first variable capacitance is selected to balance at least one of a parasitic inductance of the at least one first wirebond connection or a leakage inductance of the primary winding, and the second variable capacitance is selected to balance at least one of a parasitic inductance of the at least one second wirebond connection or the leakage inductance of the primary winding.

12. The wireless device of claim 6 further comprising a controller, and wherein the controller is configured to tune a capacitance of the at least one capacitor.

13. The wireless device of claim 12 wherein the controller is configured to tune the capacitance of the at least one capacitor to balance at least one of a leakage inductance of the primary winding or a parasitic inductance of at least one of the at least one first wirebond connection or the at least one second wirebond connection.

14. The wireless device of claim 6 further comprising at least one third wirebond connection coupled in parallel with a series combination of the at least one capacitor and the at least one of the at least one first wirebond connection or the at least one second wirebond connection.

15. The wireless device of claim 14 wherein the at least one third wirebond connection shunts a DC voltage around the at least one capacitor.

16. The wireless device of claim 14 wherein the at least one capacitor includes a first capacitor coupled in series with the at least one first wirebond connection, and a second capacitor coupled in series with the at least one second wirebond connection.

17. The wireless device of claim 16 wherein the at least one third wirebond connection includes a third wirebond connection and a fourth wirebond connection, wherein the third wirebond connection is coupled in parallel with a series combination of the first capacitor and the at least one first wirebond connection, and wherein the fourth wirebond connection is coupled in parallel with a series combination of the second capacitor and the at least one second wirebond connection.

18. The wireless device of claim 1 further comprising a shunt capacitor, wherein the power amplifier includes a positive differential output and a negative differential output, and wherein the shunt capacitor includes a first connection coupled to the positive differential output and a second connection coupled to the negative differential output.

19. A method of using a wireless device, the method comprising:
providing a power amplifier, an antenna, a balun, and at least one capacitor;
coupling the power amplifier to a balanced-line connection of the balun via a wirebond connection;
coupling the antenna to an unbalanced-line connection of the balun; and
coupling the at least one capacitor in series between the power amplifier and the balun.

20. The method of claim 19 wherein coupling the at least one capacitor in series between the power amplifier and the balun includes
coupling a first capacitor in series between a positive differential output of the power amplifier and a positive connection of a primary winding of the balun, and
coupling a second capacitor in series between a negative differential output of the power amplifier and a negative connection of the primary winding of the balun.

21. The method of claim 20 further comprising tuning a capacitance of the at least one capacitor.

22. The method of claim 21 further comprising
tuning a first capacitance of the first capacitor, and
tuning a second capacitance of the second capacitor independently of tuning the first capacitance.

23. A method of using a wireless device, the method comprising:

providing a power amplifier, an antenna, a balun, and at least one capacitor;
coupling the power amplifier to a balanced-line connection of the balun connection;
coupling the antenna to an unbalanced-line connection of the balun; and
coupling the at least one capacitor in series between the power amplifier and the balun, wherein coupling the at least one capacitor in series between the power amplifier and the balun includes
  coupling a first capacitor in series between a positive differential output of the power amplifier and a positive connection of a primary winding of the balun, and
  coupling a second capacitor in series between a negative differential output of the power amplifier and a negative connection of the primary winding of the balun.

* * * * *